(12) United States Patent
Ichimura et al.

(10) Patent No.: US 9,627,568 B2
(45) Date of Patent: Apr. 18, 2017

(54) PHOTOVOLTAIC ELEMENT

(71) Applicant: NGK Insulators, Ltd., Nagoya (JP)

(72) Inventors: Mikiya Ichimura, Nagoya (JP); Jun Yoshikawa, Nagoya (JP); Katsuhiro Imai, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 14/920,224

(22) Filed: Oct. 22, 2015

(65) Prior Publication Data

US 2016/0043261 A1 Feb. 11, 2016

Related U.S. Application Data

(63) Continuation of application No. PCT/JP2014/062400, filed on May 8, 2014.

(30) Foreign Application Priority Data

May 17, 2013 (JP) ................................ 2013-104806

(51) Int. Cl.
| | | |
|---|---|---|
| *H01L 31/00* | (2006.01) | |
| *H01L 31/077* | (2012.01) | |
| *H01L 31/0368* | (2006.01) | |
| *H01L 31/0392* | (2006.01) | |
| *H01L 31/0749* | (2012.01) | |

(52) U.S. Cl.
CPC ........ *H01L 31/077* (2013.01); *H01L 31/0368* (2013.01); *H01L 31/03923* (2013.01); *H01L 31/0749* (2013.01); *Y02E 10/541* (2013.01)

(58) Field of Classification Search
CPC ........... H01L 31/0368; H01L 31/03923; H01L 31/077; H01L 31/0749; Y02E 10/541
See application file for complete search history.

(56) References Cited

U.S. PATENT DOCUMENTS

| | | | |
|---|---|---|---|
| 5,242,504 A | * | 9/1993 | Iwamoto ........... H01L 31/03682 136/258 |
| 8,802,187 B2 | | 8/2014 | Ikenoue et al. |
| 2002/0015881 A1 | * | 2/2002 | Nakamura ........... H01G 9/2009 429/111 |

(Continued)

FOREIGN PATENT DOCUMENTS

| | | |
|---|---|---|
| JP | 51-016316 A | 2/1976 |
| JP | 07-115215 A | 5/1995 |

(Continued)

OTHER PUBLICATIONS

Kajikawa, "Texture development of non-epitaxial polycrystalline ZnO films". 2006, Journal of Crystal Growth, vol. 289, pp. 387-394, published Jan. 5, 2006.*

(Continued)

*Primary Examiner* — Nikolay Yushin
(74) *Attorney, Agent, or Firm* — Burr & Brown, PLLC

(57) ABSTRACT

Disclosed is a photovoltaic device comprising a substrate composed of an oriented polycrystalline zinc oxide sintered body in a plate shape, a photovoltaic layer provided on the substrate, and an electrode provided on the photovoltaic layer. According to the present invention, a photovoltaic device having high photoelectric conversion efficiency can be inexpensively provided.

16 Claims, 2 Drawing Sheets

(56) References Cited

U.S. PATENT DOCUMENTS

| | | | |
|---|---|---|---|
| 2006/0183625 A1* | 8/2006 | Miyahara | C04B 35/053 501/98.4 |
| 2010/0102309 A1 | 4/2010 | Nakahara et al. | |
| 2011/0062440 A1 | 3/2011 | Adekore et al. | |

FOREIGN PATENT DOCUMENTS

| JP | 09-153456 A | 6/1997 |
|---|---|---|
| JP | 3128861 B | 11/2000 |
| JP | 2003-243676 A | 8/2003 |
| JP | 2004-359495 A | 12/2004 |
| JP | 2007-201393 A | 8/2007 |
| JP | 2008-211203 A | 9/2008 |
| JP | 4378535 B | 10/2009 |
| JP | 2010-258429 A | 11/2010 |
| JP | 2011-009292 A | 1/2011 |
| JP | 2011-521477 A | 7/2011 |
| JP | 2012-146706 A | 8/2012 |
| JP | 5364782 B | 9/2013 |

OTHER PUBLICATIONS

Dutte et al., "Densification and Grain Growth in Hot-Pressed Zinc Oxide", 1969, Mat. Res. Bull., vol. 4, No. 1, pp. 797-806, published Nov. 1969.*

International Search Report and Written Opinion (With English Translation), International Application No. PCT/JP2014/062400, dated Jul. 29, 2014 (11 pages).

Nishimura, K., et al. "Efficiency Improvement in Microcrystalline Silicon Thin-film Solar Cells," (With English Abstract), *Sharp Technical Journal*, vol. 93, dated Dec. 2005, pp. 32-35 (4 pages).

* cited by examiner

PHOTOVOLTAIC ELEMENT

CROSS-REFERENCE TO RELATED APPLICATION

This application is a continuation application of PCT/JP2014/062400 filed May 8, 2014, which claims priority to Japanese Patent Application No. 2013-104806 filed May 17, 2013, the entire contents all of which are incorporated herein by reference.

BACKGROUND OF THE INVENTION

1. Field of the Invention

The present invention relates to a photovoltaic device including a zinc oxide substrate.

2. Description of the Related Art

Zinc oxide (ZnO) is a safe, inexpensive compound semiconductor and is known as a material that is chemically stable and also has excellent transparency. Zinc oxide is mainly used in the form of a sintered body or a powder, and is utilized for sputtering targets, varistors, rubber additives, cosmetics, and the like.

In particular, zinc oxide has also been used as a constituent material of a photovoltaic device, such as a solar cell and a photosensor, in recent years. For example, in silicon-based solar cells, zinc oxide is used as an underlying growth layer (see, for example, Patent Documents 1 to 3 and Non-Patent Document 1) or as a transparent electrode (see, for example, Patent Document 3 and Non-Patent Document 1). In CIGS (Cu—In—Ga—Se)-based solar cells, zinc oxide is used as an upper electrode (an n-type semiconductor layer) or a buffer layer (see, for example, Patent Document 4). Moreover, in ultraviolet sensors, zinc oxide is used as an underlying substrate (e.g., Patent Documents 5 and 6), as an n-type semiconductor layer (see, for example, Patent Documents 5 to 7), or as a p-type semiconductor layer (see, for example, Patent Document 5). In some cases, zinc oxide is also used as a constituent material of a photoconductive effect device (a photosensor) (see, for example, Patent Document 8).

Disclosures concerning zinc oxide in the aforementioned patent documents are, for example, as follows. Patent Documents 1 and 2 disclose that, desirably, zinc oxide used as an underlying growth layer of a silicon-based solar cell is c-axis-oriented in order for a silicon film that will be grown thereon to be preferentially (111)-oriented. Patent Documents 1 to 3 and Non-Patent Document 1 disclose that zinc oxide used as an underlying growth layer of a silicon-based solar cell is formed on a glass or like support substrate generally by using a sputtering method. Patent Document 8 discloses that zinc oxide by a commonly used sputtering method grows in a microcrystalline state to have a grain diameter of about 50 to 100 nm. Patent Document 2 and Non-Patent Document 1 disclose that, desirably, the silicon film of a silicon-based solar cell is composed of large silicon grains for enhanced photoelectric conversion efficiency. Patent Document 4 discloses that in a CIGS-based solar cell, a lower electrode layer, a photoelectric conversion layer, a buffer layer, and an upper electrode are formed in this order on an underlying substrate. Patent Document 4 discloses that ZnO used as the upper electrode in the CIGS-based solar cell functions as a transparent electrode as well as an n-type semiconductor layer. Patent Documents 5 and 6 disclose that zinc oxide used as an underlying substrate of an ultraviolet sensor is generally single-crystal zinc oxide. Patent Document 7 discloses that in some cases, a glass plate, a metal plate, or the like is used as an underlying substrate of an ultraviolet sensor, and a semiconductor functional layer is formed thereon.

Patent Document 10 discloses a method for producing an oriented polycrystalline zinc oxide sintered body in which the a-axis or the c-axis is oriented in a predetermined direction. According to this document, a rotating magnetic field is applied to a slurry, in which hexagonal zinc oxide crystal particles are dispersed, to cause the crystal particles to be oriented, then the slurry is solidified by drying to prepare a green body, and this green body is sintered in an oxygen-containing atmosphere to produce an oriented polycrystalline zinc oxide sintered body.

CITATION LIST

Patent Documents

Patent Document 1: JP H07-115215A
Patent Document 2: JP H09-153456A
Patent Document 3: JP 2003-243676A
Patent Document 4: JP 2010-258429A
Patent Document 5: JP 2007-201393A
Patent Document 6: JP 2008-211203A
Patent Document 7: JP 2012-146706A
Patent Document 8: JP 2011-9292A
Patent Document 9: JP 3128861B
Patent Document 10: JP 4378535B
Patent Document 11: JP 5364782B Non-Patent Document Non-Patent Document 1: Kazuhito Nishimura et al., "Efficiency Improvement in Microcrystalline Silicon Thin-Film Solar Cells", Sharp Technical Journal, Vol. 93, December 2005, pp. 32-35

SUMMARY OF THE INVENTION

It is desirable for a silicon-based solar cell to have large-size silicon crystal grains from the viewpoint of an enhanced open-circuit voltage. However, a high-temperature process by which a large grain size is easily obtained requires an expensive high-vacuum apparatus for suppressing the incorporation of oxygen impurities into the cell (see, for example, Non-Patent Document 1). In this regard, it is known that a large crystal grain size is also desirable for CIGS-based solar cells, and thus the above problem is similarly applicable thereto.

On the other hand, the use of a zinc oxide single crystal, which is an inexpensive material, as an underlying substrate of an ultraviolet sensor results in the following problems due to the high specific resistance of generally available zinc oxide single crystals. First, due to the presence of a highly resistant substrate in the photocurrent (an electric current generated during photoirradiation) path, the efficiency of photocurrent extraction is poor. Second, the voltage is shared between the substrate and the photosensitive layer when a reverse bias voltage (required for a device to be driven as a sensor) is applied, and thus an extra voltage needs to be applied in order to apply a sufficient voltage to the photosensitive layer. On the other hand, when a semiconductor functional layer is formed on a glass plate, a metal plate, or the like used as the underlying substrate of an ultraviolet sensor, it is difficult to enhance the crystal quality of the semiconductor functional layer (for example, a poor orientation and a small crystal grain size), and the carrier diffusion length is short, thus resulting in the problem of poor photocurrent generation efficiency.

The inventors have currently found that a photovoltaic device having high photoelectric conversion efficiency can be inexpensively provided by using a plate-like oriented polycrystalline zinc oxide sintered body as an underlying substrate for a photovoltaic device.

Accordingly, an object of the present invention is to inexpensively provide a photovoltaic device having high photoelectric conversion efficiency.

According to an aspect of the present invention, there is provided a photovoltaic device comprising:
 a substrate composed of an oriented polycrystalline zinc oxide sintered body in a plate shape;
 a photovoltaic layer provided on the substrate; and
 an electrode provided on the photovoltaic layer.

DETAILED DESCRIPTION OF THE INVENTION

Photovoltaic Device

The present invention relates to a photovoltaic device. The photovoltaic device is a device that takes advantage of a phenomenon in which electromotive force is generated by irradiating an object with light (i.e., a photovoltaic effect). The photovoltaic device of the present invention can have a variety of forms such as a PIN photodiode, a PN photodiode, and a Schottky photodiode, and its applications include various sensors such as an ultraviolet photodiode/sensor, a visible light photodiode/sensor, and an infrared photodiode/sensor, various solar cells such as a silicon-based solar cell and a CIGS-based solar cell. In a preferable embodiment of the present invention, the photovoltaic device is used as a silicon-based solar cell or a CIGS-based solar cell. In another preferable embodiment of the present invention, the photovoltaic device is used as an ultraviolet sensor.

Figure 1:
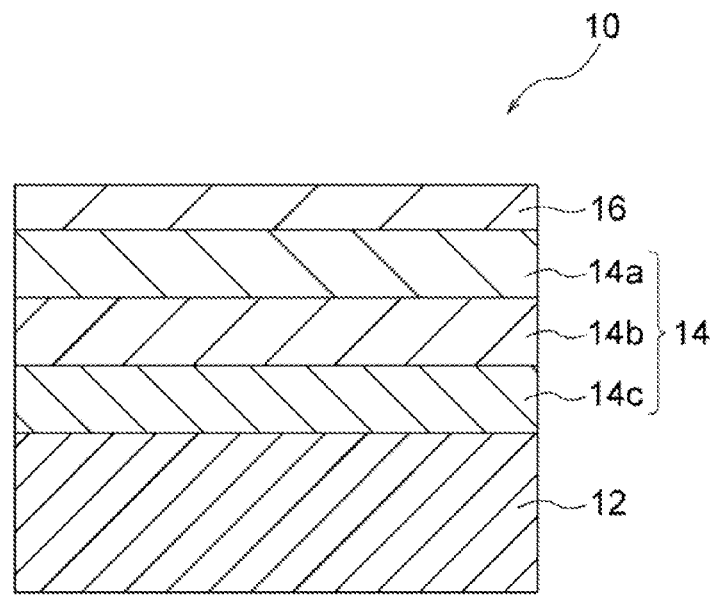
FIG. 1 is a cross-sectional schematic diagram showing one example of the photovoltaic device of the present invention.

FIG. 1 schematically shows the configuration of a photovoltaic device according to one aspect of the present invention. A photovoltaic device 10 shown in FIG. 1 comprises a substrate 12, a photovoltaic layer 14 provided on the substrate, and an electrode 16 provided on the photovoltaic layer. Although the photovoltaic device 10 has a layer configuration as a PIN photodiode, the photovoltaic device of the present invention is not limited thereto and may have a variety of forms and applications as described above.

The substrate 12 is composed of an oriented polycrystalline zinc oxide sintered body that is in a plate shape. Zinc oxide crystal has a hexagonal wurtzite structure, and the oriented polycrystalline zinc oxide sintered body is a solid in which a countless number of zinc oxide crystal grains are bonded to each other by sintering in an oriented manner. Zinc oxide crystal grains contain zinc oxide, and may contain a dopant and an inevitable impurity as other elements or may be composed of zinc oxide and an inevitable impurity. Such other elements may be substituted for the Zn site and the O site of the hexagonal wurtzite structure, may be contained as additive elements that do not constitute the crystal structure, or may exist at grain boundaries. Also, the zinc oxide sintered body may contain another phase or another element as described above in addition to zinc oxide crystal grains, but preferably the zinc oxide sintered body is composed of zinc oxide crystal grains and an inevitable impurity. Nevertheless, the oriented polycrystalline zinc oxide sintered body may be composed of ZnO formed into a mixed crystal with a crystal of one or more selected from the group consisting of MgO, CdO, ZnS, ZnSe, and ZnTe, and, moreover, the oriented polycrystalline zinc oxide sintered body may be doped with an n-type dopant so that the substrate 12 functions as an n-type zinc oxide layer. Preferable examples of n-type dopants include one or more selected from the group consisting of aluminum (Al), gallium (Ga), indium (In), boron (B), fluorine (F), chlorine (Cl), bromine (Br), iodine (I), and silicon (Si).

In any case, the oriented polycrystalline zinc oxide sintered body is composed of a zinc oxide sintered body containing numerous zinc oxide single crystal grains which are to some extent or highly oriented in a certain direction. The polycrystalline zinc oxide sintered body oriented in this way is mechanically stronger and less expensive than zinc oxide single crystals and yet makes it possible to achieve high photoelectric conversion efficiency. This is because when a photovoltaic layer is formed on a polycrystalline zinc oxide sintered body, smooth crystal growth of a constituent material of the photovoltaic layer is induced due to the orientation of the sintered body, resulting in an increased crystal grain size and an enhanced photovoltaic-layer crystal quality. For example, in the case of a silicon-based solar cell, it is possible to increase the grain size of silicon crystals, and the efficiency of power generation is enhanced. Similarly, in the case of a CIGS-based solar cell, it is possible to increase the grain size of CIGS crystals, and the efficiency of power generation is enhanced. On the other hand, in the case of an ultraviolet sensor, the crystal quality of the photovoltaic layer, which is a semiconductor functional layer, is enhanced, and the sensor sensitivity is enhanced, in comparison to the case of the growth on a substrate such as a glass plate or a metal plate. In particular, when the constituent layers of the photovoltaic layer 14 are formed by epitaxial growth on the oriented substrate 12, a state in which the crystallographic direction is aligned in the normal direction is achieved, therefore the aforementioned increase of the crystal grain size and/or enhancement of the crystal quality of the photovoltaic layer is achieved at a higher level, and a higher photoelectric conversion efficiency is obtained. The polycrystalline zinc oxide sintered body oriented in this way is stronger and less expensive than zinc oxide single crystals in the first place and, therefore, also enables manufacture of photovoltaic devices that are significantly less expensive and yet have a larger area than those manufactured by using a single crystal substrate.

On the other hand, in the case where a non-oriented polycrystalline zinc oxide sintered body is used for the substrate, grains with various crystallographic directions undergo crystal growth in random directions when the constituting layers of the photovoltaic layer 14 are formed. As a result, crystal phases mutually interfere and inhibit epitaxial growth, and it is thus not possible to form a state in which the crystallographic direction is aligned in the normal direction of the substrate. Moreover, since the rate of crystal growth is different depending on the plane direction, a homogenous, flat photovoltaic layer cannot be formed, and it is thus difficult to form a photovoltaic layer of good quality.

As described above, the use of an oriented polycrystalline zinc oxide substrate enables manufacture of photovoltaic devices that are less expensive and have a larger area than those manufactured when a single crystal substrate is used. Accordingly, it is preferable that the substrate 12 has an area of 25 cm² or greater, more preferably 100 cm² or greater, and even more preferably 400 cm² or greater. In other words, it is preferable that the substrate 12 has a size of 5 cm×5 cm or greater, more preferably 10 cm×10 cm or greater, and even more preferably 20 cm×20 cm or greater. The larger the substrate 12 is, the more preferable it is, because the photovoltaic device can be used in a wider variety of applications such as solar cells, so the upper limit of the area or the size should not be specified.

The average grain diameter of zinc oxide single crystal grains constituting the oriented polycrystalline zinc oxide sintered body is preferably 1 to 100 μm, more preferably 10 to 80 μm, and even more preferably 20 to 50 μm. An average grain diameter within these ranges results in excellent photoelectric conversion efficiency, mechanical strength, and like properties. The average grain diameter of the sintered body of the present invention is measured by the following method. That is, a sample having an appropriate size is cut out from a plate-like sintered body, a surface perpendicular to the plate surface is polished and subjected to etching in 0.3 M nitric acid for 10 seconds, and then an image is taken with a scanning electron microscope. The visual field range is determined in such a way that when straight lines parallel and perpendicular to the plate surface are drawn, each straight line crosses 10 to 30 grains. The average grain diameter is determined by: drawing three straight lines parallel to the plate surface; taking the average of the line segment lengths inside all grains crossed by the straight lines; multiplying the average by 1.5 to give a value regarded as $a_1$; similarly, drawing three straight lines perpendicular to the plate surface; taking the average of the line segment lengths inside all grains crossed by the straight lines; multiplying the average by 1.5 to give a value regarded as $a_2$; and calculating $(a_1+a_2)/2$.

The direction of the oriented plane of the oriented polycrystalline zinc oxide sintered body is not particularly limited, and the (100) plane, (002) plane, or (101) plane is preferably exemplified. As for the degree of orientation, it is preferable that the degree of orientation at the substrate surface is, for example, 50% or greater, more preferably 65% or greater, and even more preferably 75% or greater. The degree of orientation can be determined by obtaining an XRD profile through irradiating the surface of plate-like zinc oxide with X rays using an XRD apparatus (such as trade name "RINT-TTR III" manufactured by Rigaku Corporation) and making a calculation according to the following formulae.

$$F_{(hkl)} = \frac{p - p_0}{1 - p_0} \times 100 \quad \text{[Formula 1]}$$

$$p_0 = \frac{I_0(hkl)}{I_0(100) + I_0(002) + I_0(101) + I_0(102)}$$

$$p = \frac{I_s(hkl)}{I_s(100) + I_s(002) + I_s(101) + I_s(102)}$$

where $F_{hkl}$ is the degree of orientation of the (hid) plane; $I_0$(hkl) is the diffraction intensity (integral value) of the (hkl) plane in ICDD No. 361451; $I_0$(100), $I_0$(002), $I_0$(101), and $I_0$(102) are the diffraction intensities (integral values) of the (100) plane, (002) plane, (101) plane, and (102) plane in ICDD No. 361451, respectively; $I_s$(hkl) is the diffraction intensity (integral value) of the (hkl) plane in a sample; and $I_s$(100), $I_s$(002), $I_s$(101), and $I_s$(102) are the diffraction intensities (integral values) of the (100) plane, (002) plane, (101) plane, and (102) plane in a sample, respectively.

The photovoltaic layer 14 is provided on the substrate. The photovoltaic layer 14 may be a layer responsible for the photoelectric converting function of the photovoltaic device, and the type and the system of the photovoltaic device are not limited as long as a desired photoelectric converting function can be secured on the oriented polycrystalline zinc oxide sintered body that is a constituent material of the substrate 12. It is preferable that the photovoltaic layer 14 comprises any one selected from the group consisting of a combination of an n-type layer, an i-type layer, and a p-type layer, a combination of an n-type layer, a buffer layer, and a p-type layer, a combination of an n-type layer and a p-type layer, and a combination of an n-type layer and a metal thin film. In this regard, the photovoltaic layer 14 of the illustrated example is composed of a combination of a p-type layer 14a, an i-type layer 14b, and an n-type layer 14c. Such a combination of an n-type layer, an i-type layer, and a p-type layer is a layer configuration corresponding to the PIN photodiode, and the layers may be suitably fabricated according to a known layer configuration employed in PIN photodiodes. A combination of an n-type layer, a buffer layer, and a p-type layer can be regarded as a type of PIN photodiode or a form analogous thereto, and the layers may be suitably fabricated according to a known layer configuration employed in solar cells such as CIGS solar cells. Moreover, a combination of an n-type layer and a p-type layer is a layer configuration corresponding to the PN photodiode, and the layers may be suitably fabricated according to a known layer configuration employed in PN photodiodes. Furthermore, a combination of an n-type layer and a metal thin film is a layer configuration corresponding to the Schottky photodiode, and the layers may be suitably fabricated according to a known layer configuration employed in Schottky photodiodes, such as a configuration in which a depletion layer is formed by Schottky contact with an ultrathin film of a metal having a large work function (such as Au, Pt, or the like) as a metal thin film. In other words, the photovoltaic device of the present invention is preferably any one of a PIN photodiode, a PN photodiode, and a Schottky photodiode. When the oriented polycrystalline zinc oxide sintered body is doped with an n-type dopant and thereby the substrate functions as an n-type layer as described above, it is preferable that the photovoltaic layer comprises any one selected from the group consisting of a combination of an i-type layer and a p-type layer, a combination of a buffer layer and a p-type layer, a p-type layer alone, and a metal thin film alone. In this case, the combination of an n-type substrate, an i-type layer, and a p-type layer, the combination of an n-type substrate, a buffer layer, and a p-type layer, the combination of an n-type substrate and a p-type layer alone, and the combination of an n-type substrate and a metal thin film correspond to the PIN photodiode, the solar cell, the PN photodiode, and the Schottky photodiode, respectively. Moreover, as one form of a p-type layer/i-type layer/n-type layer configuration, a quantum well structure can be adopted in which the thickness of the i-type layer is small. The layers constituting the photovoltaic layer 14 may be each suitably determined according to a known technique depending on the end-use of the photovoltaic device.

In the case of a photovoltaic device for a silicon-based solar cell, a known configuration as disclosed in Patent Document 1 can be employed. For example, the p-type layer and the n-type layer may be composed of an amorphous silicon-based semiconductor material, a microcrystalline silicon-based semiconductor material, or a polycrystalline silicon-based semiconductor material. Examples of the amorphous (abbreviated as a-) silicon-based semiconductor material include a-Si, a-SIC, a-SiGe, a-SiGeC, a-SiO, a-SiN, a-SiON, a-SiCON, and the like. Examples of the microcrystalline (abbreviated as μc-) silicon-based semiconductor material include μc-Si, μc-SiC, μc-SiGe, μc-SiO, μc-SiGeC, μc-SiN, μc-SiON, μc-SiOCN, and the like. Examples of the polycrystalline (abbreviated as poly-) silicon-based semiconductor material include poly-Si, poly-SiC, poly-SiGe, and the like. In particular, for a layer on the light incident side, a crystalline semiconductor material that barely absorbs light or an amorphous semiconductor layer that has a wide band gap is suitable, and specific examples include a-SIC, a-SiO, a-SiN, a-SiON, a-SiCON, μc-Si, μc-SiC, μc-SiO, μc-SiN, μc-SiON, μc-SiOCN, poly-Si, poly-SiC, and the like. The i-type layer is composed of an amorphous silicon-based semiconductor material containing hydrogen, and examples include a-Si, a-SiC, a-SiGe, a-SiGeC, a-SiSn, a-SiSnC, a-SiSnGe, and a-SiSnGeC. A layer that is slightly p-type or slightly n-type is also usable as the i-type layer. The amount of a valence electron controlling agent introduced to provide a p-type or n-type conduction is preferably in a range of 1000 ppm to 10%.

In the case of a photovoltaic device for a CIGS-based solar cell, a known configuration as disclosed in Patent Document 4 is applicable. For example, the p-type layer may be composed of $Cu(In,Ga)Se_2$ (CIGS), $Cu(In,Ga)(SeS)_2$ (CIGSS), or a combination thereof. The buffer layer interposed between the p-type layer and the n-type layer may be composed of CdS, ZnS, ZnO, ZnMgO, ZnS(O,OH), or a combination thereof, with CdS being preferable. As the n-type layer, n-type ZnO is preferably used. Accordingly, a substrate composed of a plate-like oriented polycrystalline zinc oxide sintered body can be used as n-type ZnO. It is common practice to form a Mo electrode layer, a p-type layer, a buffer layer, and an n-type layer in this order on a glass substrate in conventional manufacture of CIGS-based solar cells, but according to the photovoltaic device of the present invention, a substrate made of an oriented polycrystalline zinc oxide sintered body can be used as this n-type layer. In this case, contrary to the conventional manufacturing sequence, a buffer layer, a p-type layer, and a Mo electrode layer are formed in this order on a substrate made of an oriented polycrystalline zinc oxide sintered body (n-type zinc oxide), and thereby a CIGS-based solar cell can be made. Accordingly, a glass substrate as previously required is unnecessary, and thus simplification and cost-reduction of the manufacturing process can be achieved as well. Although the above description has been provided for a CIGS-based solar cell, it is also suitable for making a CIGS-based, VIS-IR photodiode.

Group III-V compound semiconductors not only provide high conversion efficiency by forming a single pn junction using a group III-V compound semiconductor but also are usable for multi-junction solar cells in which a plurality of pn junctions are formed using semiconductors that each absorb light in a mutually different wavelength range. Specifically, an $In_{(1-x)}Ga_xN$-based solar cell (band gap: 0.7 to 3.4 eV approximately, $0 \leq x < 1$) is known (see, for example, Patent Document 11 (JP 5364782B)). In the case of a photovoltaic device for a group III-V compound semiconductor-based solar cell, a known configuration as disclosed in Patent Document 11 is applicable. $In_{(1-x)}Ga_xN$ doped with at least one p-type dopant such as Mg or Zn is usable as a p-type layer, and $In_{(1-x)}Ga_xN$ doped with at least one n-type dopant such as Si, Ge, or Sn is usable as an n-type layer. Although quartz, sapphire, or the like is commonly used as a substrate material in a conventional structure, an oriented polycrystalline zinc oxide sintered body can be used as a substrate according to the photovoltaic device of the present invention. In this case, imparting electrical conductivity to the substrate makes it possible to use the substrate as an electrode. In particular, since zinc oxide has a high lattice match with an $In_{(1-x)}Ga_xN$-based material, a high-quality semiconductor layer can be directly produced on the substrate even without a buffer layer. Nevertheless, a buffer layer may be used to suppress interdiffusion of zinc oxide and the $In_{(1-x)}Ga_xN$-based material. As a method for forming a film of an $In_{(1-x)}Ga_xN$-based material, a known method can be employed, and preferable examples include vapor phase methods such as MOCVD (metal organic chemical vapor deposition), MBE (molecular beam epitaxy), HVPE (halide vapor phase epitaxy), and sputtering, liquid phase methods such as Na flux method, ammonothermal method, hydrothermal method, and sol-gel method, powder methods that utilize solid phase growth of powder, and combinations of these.

Alternatively, for a PIN photodiode, at least one of the p-type layer, the i-type layer, and the n-type layer (in particular, the n-type layer) or all layers, and for a PN photodiode, at least one layer of the p-type layer and the n-type layer (in particular, the n-type layer) or all layers, may be composed of a zinc oxide-based material. Such a configuration is particularly suitable for an ultraviolet photodiode. In this case, it is easy to match the orientation or the crystallographic direction with that of the substrate which is also composed of zinc oxide, and thereby the photoelectric conversion efficiency can be increased. In this case, it is preferable that the photovoltaic layer 14 includes at least a p-type zinc oxide layer 14a composed of ZnO doped with a p-type dopant. Accordingly, a photovoltaic device based on a p-i-n junction or a p-n junction can be formed in combination with an i-type zinc oxide layer 14b and/or an n-type zinc oxide layer 14c. On the other hand, even in the case where a configuration without the n-type zinc oxide layer 14c is employed, configuring the substrate 12 to be able to function as an n-type zinc oxide layer makes it possible to form a photovoltaic device based on a p-i-n junction or a p-n junction in combination with the substrate 12. Preferable examples of p-type dopants include one or more selected from the group consisting of nitrogen (N), phosphorus (P), arsenic (As), carbon (C), lithium (Li), sodium (Na), potassium (K), silver (Ag), and copper (Cu). Moreover, the p-type zinc oxide layer may be composed of ZnO formed into a mixed crystal with a crystal of one or more selected from the group consisting of MgO, CdO, ZnS, ZnSe, and ZnTe, and this mixed-crystal ZnO may be doped with a p-type dopant. For example, a compound in which $Mg_xZn_{1-x}O$ ($0.1 \leq x \leq 0.4$), which is a mixed crystal of ZnO and MgO, is doped with N is particularly preferable. Forming ZnO into a mixed crystal with MgO widens the band gap and makes it possible to shift the wavelength of received light toward the high energy side. Moreover, ZnO may be formed into a mixed crystal with CdO, ZnS, ZnTe, or ZnSe, and this narrows the band gap and makes it possible to shift the wavelength of received light toward the low energy side. As described above, the photovoltaic layer 14 may further comprise the n-type zinc oxide layer 14c doped with an n-type dopant between the p-type zinc oxide layer 14a and the substrate 12. Preferable examples of n-type dopants include one or more selected from the group consisting of aluminum (Al), gallium (Ga), indium (In), boron (B), fluorine (F), chlorine (Cl), bromine (Br), iodine (I), and silicon (Si). Moreover, the n-type zinc oxide layer may be composed of ZnO formed into a mixed crystal with a crystal of one or more selected from the group consisting of MgO, CdO, ZnS, ZnSe, and ZnTe, and this mixed-crystal ZnO may be doped with an n-type dopant. For example, a compound in which $Mg_xZn_{1-x}O$ ($0.1 \leq x \leq 0.4$), which is a mixed crystal of ZnO and MgO, is doped with Al or Ga is particularly preferable. As described above, when the substrate 12 is configured to function as an n-type zinc oxide layer, the n-type zinc oxide layer 14c can be omitted. In addition, as described above, the photovoltaic layer 14 may have the i-type zinc oxide layer 14b composed of ZnO or a mixed crystal of ZnO and one or more selected from the group consisting of MgO, CdO, ZnS, ZnSe, and ZnTe having a smaller band gap than both the p-type zinc oxide layer 14a and the n-type zinc oxide layer 14c and that contains neither a p-type dopant nor an n-type dopant, between the p-type zinc oxide layer 14a and the n-type zinc oxide layer 14c. A configuration in which this i-type layer is thin corresponds to the photovoltaic device having a quantum well structure, which is one form of a p-n junction, and photoelectric conversion efficiency can be further increased. When an n-type zinc oxide substrate is used without the n-type zinc oxide layer 14c, the photovoltaic layer 14 may be configured to have at least an i-type zinc oxide layer that has a smaller band gap than both the p-type zinc oxide layer 14a and the oriented polycrystalline zinc oxide sintered body 12, that is composed of ZnO or a mixed crystal of ZnO and one or more selected from the group consisting of MgO, CdO, ZnS, ZnSe, and ZnTe, and that contains neither a p-type dopant nor an n-type dopant, between the p-type zinc oxide layer 14a and the oriented polycrystalline zinc oxide sintered body 12.

It is particularly preferable that the photovoltaic layer 14 has a structure epitaxially grown in conformity with the orientation of the oriented polycrystalline zinc oxide sintered body and thereby has a crystallographic direction aligned in the normal direction. Due to the orientation of the polycrystalline zinc oxide sintered body, which is a component of the substrate 12, the crystallographic direction of the photovoltaic layer 14 is also developed in conformity with the orientation of the substrate 12 and therefore becomes uniform, and the aforementioned increase of the crystal grain size and/or enhancement of the photovoltaic layer crystal quality is achieved at a higher level, and a higher photoelectric conversion efficiency is obtained. The film formation method for the photovoltaic layer 14 having such a structure is not particularly limited as long as it promotes growth in conformity with the orientation of the substrate, and preferable examples include sputtering, molecular beam epitaxy (MBE), solid-phase epitaxial growth methods, and the like. A solid-phase epitaxial growth method can be preferably performed by, for example, forming a film on a substrate by an aerosol deposition method (AD method) in advance and then heating the film to be single-crystallized. In this way, the functional layer is grown in conformity with the sintered grain diameter of the polycrystalline zinc oxide sintered body, and therefore a structure similar to an aggregate of columnar structures is obtained in which the normal direction is aligned unidirectionally (single crystals) and grain boundaries exist in the x-y direction. In this case, since the photovoltaic layer has grain boundaries in the x-y direction, light in the horizontal direction is scattered and reflected by grain boundaries, and, as a result, light in the normal direction becomes intensified. As a result, the directivity of light is increased, and higher intensity and higher efficiency are obtained.

An electrode 16 is provided on the photovoltaic layer 14. The electrode 16 may be composed of a known electrode material depending on the application of the phovoltaic device, and configuring the electrode 16 to be a transparent electroconductive film such as ITO or a metal electrode with a lattice structure, a moth-eye structure, or the like having a high aperture ratio is preferable for being able to increase the light receiving efficiency at the photovoltaic layer 14. In the case of a photovoltaic device for a CIGS-based solar cell, the electrode 16 is preferably composed of Mo, Cr, W, or a combination thereof, with Mo being particularly preferable.

In FIG. 1, the substrate 12 is configured to function as a counter electrode, but otherwise, a counter electrode may be provided on the opposite side of the substrate 12 from the photovoltaic layer 14. When the substrate 12 does not have sufficient electrical conductivity, the n-type layer included in the photovoltaic layer 14 may be configured to be an electrode, or an electrode may be provided on the n-type layer.

Method for Producing Oriented Polycrystalline Zinc Oxide Sintered Body

As will be described below, the oriented polycrystalline zinc oxide sintered body used as the substrate 12 can be produced by shaping and sintering using a plate-like zinc oxide powder for a raw material, in addition to a method in which a magnetic field is applied to zinc oxide crystal particles (e.g., a method as disclosed in Patent Document 10 (JP 4378535B)).

(1) Preparation of Plate-Like Zinc Oxide Powder

Plate-like zinc oxide powder that serves as a raw material may be produced by any method as long as an oriented sintered body is obtained by shaping and firing steps, which will be described below. For example, in order to obtain a (101) plane-oriented sintered body, a plate-like zinc oxide powder produced by the method disclosed in Patent Document 9 (JP 3128861B) may be used as a raw material.

According to a preferable embodiment of the present invention, a plate-like zinc oxide powder produced by the following production method may be used as a raw material in order to obtain a (002) plane-oriented sintered body. This plate-like zinc oxide powder can be prepared by a method including the steps of subjecting a zinc ion-containing raw material solution to a solution method to produce plate-like zinc oxide precursor particles, and calcining the plate-like precursor particles by increasing the temperature to a calcination temperature at a rate of temperature increase of 150° C./h or lower to produce a zinc oxide powder composed of a plurality of plate-like zinc oxide particles.

In the plate-like zinc oxide powder production method for obtaining a (002) plane-oriented sintered body, first, plate-like zinc oxide precursor particles are produced by a solution method using a zinc ion-containing raw material solution. Examples of zinc ion sources include zinc sulfate, zinc nitrate, zinc chloride, organic acid salts such as zinc acetate, zinc alkoxides, and the like. Zinc sulfate is preferable because it can also supply sulfate ions, which will be described below. A production technique for plate-like zinc oxide precursor particles by a solution method is not particularly limited, and production can be performed according to a known technique.

It is preferable that the raw material solution comprises a water-soluble organic material and sulfate ions because a porous material having a large specific surface area can be obtained. Examples of the water-soluble organic material include alcohols, polyols, ketones, polyethers, esters, carboxylic acids, polycarboxylic acids, celluloses, saccharides, sulfonic acids, amino acids, and amines, and more specifically, aliphatic alcohols such as methanol, ethanol, propanol, butanol, pentanol, and hexanol; aliphatic polyhydric alcohols such as ethylene glycol, propanediol, butanediol, glycerine, polyethylene glycol, and polypropylene glycol; aromatic alcohols such as phenol, catechol, and cresol; alcohols having a heterocycle such as furfuryl alcohol; ketones such as acetone, methyl ethyl ketone, and acetylacetone; ethers or polyethers such as ethyl ether, tetrahydrofuran, dioxane, polyoxyalkylene ether, ethylene oxide adduct, and propylene oxide adduct; esters such as ethyl acetate, ethyl acetoacetate, and glycine ethyl ester; carboxylic acids polycarboxylic acids, or hydroxycarboxylic acids, such as formic acid, acetic acid, propionic acid, butanoic acid, butyric acid, oxalic acid, malonic acid, citric acid, tartaric acid, gluconic acid, salicylic acid, benzoic acid, acrylic acid, maleic acid, glyceric acid, eleostearic acid, polyacrylic acid, polymaleic acid, and acrylic acid-maleic acid copolymer, and salts thereof; carboxymethylcelluloses; monosaccharides such as glucose and galactose; polysaccharides such as sucrose, lactose, amylose, chitin, and cellulose; sulfonic acids such as alkylbenzenesulfonic acid, para-toluenesulfonic acid, alkylsulfonic acid, α-olefinsulfonic acid, polyoxyethylenealkylsulfonic acid, ligninsulfonic acid, and naphthalenesulfonic acid, and salts thereof; amino acids such as glycine, glutamic acid, aspartic acid, and alanine; hydroxyamines such as monoethanolamine, diethanolamine, triethanolamine, and butanolamine; trimethyl aminoethyl alkylamide; alkylpyridinium sulfuric acid salts; alkyltrimethylammonium halides; alkylbetaines; alkyl diethylene triamino acetic acids; and the like. Among these water-soluble organic materials, those that have at least one functional group from a hydroxyl group, a carboxyl group, and an amino group are preferable, and hydroxycarboxylic acids having a hydroxyl group and a carboxyl group and salts thereof are particularly preferable, with examples being sodium gluconate, tartaric acid, and the like. It is preferable that the water-soluble organic material coexists in a range of about 0.001 wt % to about 10 wt % in an aqueous ammonia-added raw material solution, which will be described below. A preferable sulfate ion source is zinc sulfate as stated above. The raw material solution may further comprise the above-described additive substance such as a dopant.

At this time, the raw material solution is preferably heated to a preliminary reaction temperature of 70 to 100° C. and more preferably 80 to 100° C. After or during this heating, aqueous ammonia is preferably added to the raw material solution, and the raw material solution to which aqueous ammonia has been added is preferably kept at a temperature of 70 to 100° C. for 0.5 to 10 hours and more preferably at a temperature of 80 to 100° C. for 2 to 8 hours.

Next, the plate-like precursor particles are calcined by increasing the temperature to a calcination temperature at a rate of temperature increase of 150° C./h or lower to produce a zinc oxide powder composed of a plurality of plate-like zinc oxide particles. It is considered that by reducing the rate of temperature increase to 150° C./h or lower, the crystal plane of the precursor material is easily inherited by zinc oxide when the precursor material changes into zinc oxide, thus resulting in an enhanced degree of orientation of plate-like particles in a green body. Also, it is considered that the connectivity of primary particles to each other is increased, and plate-like particles are thus unlikely to collapse. A preferable rate of temperature increase is 120° C./h or lower, more preferably 100° C./h or lower, even more preferably 50° C./h or lower, particularly preferably 30° C./h or lower, and most preferably 15° C./h or lower. The zinc oxide precursor particles are preferably washed, filtered, and dried before calcination. The calcination temperature is not particularly limited as long as the precursor compound such as zinc hydroxide can change into zinc oxide, and the calcination temperature is preferably 800 to 1100° C. and more preferably 850 to 1000° C. The plate-like precursor particles are kept at such a calcination temperature preferably for 0 to 3 hours and more preferably for 0 to 1 hour. Such temperature retaining conditions enable the precursor compound such as zinc hydroxide to change more reliably into zinc oxide. Due to such a calcination step, the plate-like precursor particles change into plate-like zinc oxide particles that have many pores.

Optionally, the zinc oxide powder may be mixed with an additive substance. Such additive substances may be, as secondary components, various additive agents or dopants as described above, which impart properties (such as electroconductive or insulative properties) desired depending on the use or the specification of a green body. These dopant elements may be added in the form of compounds containing these elements or in the form of ions to the zinc oxide powder. A method for adding the additive substance is not particularly limited, and in order to allow the additive substance to reach the interior of the fine pores of the zinc oxide powder, preferable examples of such methods include (1) a method in which the additive substance is added in the form of a fine powder such as nanoparticles to the zinc oxide powder; (2) a method in which the additive substance is dissolved in a solvent and then added to the zinc oxide powder, and this solution is dried; and similar methods.

According to another preferable embodiment of the present invention, a plate-like zinc oxide powder produced by the following production method may be used as a raw material in order to obtain a (100) plane-oriented sintered body. This plate-like zinc oxide powder can be obtained by adding an aqueous alkaline solution to an aqueous zinc salt solution, stirring the mixture at 60 to 95° C. for 2 to 10 hours to form a precipitate, washing and drying this precipitate, and, further, grinding the resulting precipitate. The aqueous zinc salt solution may be a zinc ion-containing aqueous solution and is preferably an aqueous solution of a zinc salt such as zinc nitrate, zinc chloride, or zinc acetate. The aqueous alkaline solution is preferably an aqueous solution of sodium hydroxide, potassium hydroxide, or the like. Although the concentrations and the mixing ratio of the aqueous zinc salt solution and the aqueous alkaline solution are not particularly limited, it is preferable that an aqueous zinc salt solution and an aqueous alkaline solution having the same molar concentration are mixed in the same volume ratio. It is preferable to wash the precipitate with ion exchanged water multiple times. The washed precipitate is preferably dried at 100 to 300° C. Since the dried precipitate is spherical secondary particles in which plate-like zinc oxide primary particles are aggregated, it is preferable to subject the dried precipitate to a grinding step. It is preferable to perform this grinding with a ball mill for 1 to 10 hours after adding a solvent such as ethanol to the washed precipitate. This grinding yields a plate-like zinc oxide powder as primary particles. The plate-like zinc oxide powder obtained in this way preferably has a volume-based D50 average particle diameter of 0.1 to 1.0 µm, and more preferably 0.3 to 0.8 µm. This volume-based D50 average particle diameter can be measured with a laser diffraction particle size distribution analyzer.

(2) Shaping and Firing Steps

The plate-like zinc oxide powder produced by the above method is oriented by a technique in which shearing force is used, to give an oriented green body. At this time, another element or component such as a dopant metal oxide powder (such as $\alpha$-$Al_2O_3$ powder) may be added to the plate-like zinc oxide powder. Preferable examples of techniques in which shearing force is used include tape casting, extrusion molding, a doctor blade method, and any combination of these. Regarding the orientation techniques in which shearing force is used, in any of the techniques exemplified above as well, it is preferable that additives such as a binder, a plasticizer, a dispersant, and a dispersion medium are suitably added to the plate-like zinc oxide powder to form a slurry, and this slurry is passed through a slit-like narrow discharge port to discharge and shape the slurry into a sheet form on a substrate. The slit width of the discharge port is preferably 10 to 400 μm. The amount of the dispersion medium is adjusted so that the viscosity of the slurry is preferably 5000 to 100000 cP and more preferably 20000 to 60000 cP. The thickness of the oriented green body shaped into a sheet form is preferably 5 to 500 μm and more preferably 10 to 200 μm. It is preferable that multiple pieces of this oriented green body that has been shaped into a sheet form are stacked to form a precursor laminate having a desired thickness, and this precursor laminate is subjected to press molding. This press molding can be preferably performed by packaging the precursor laminate in a vacuum pack or the like and subjecting it to isostatic pressing in hot water at a temperature of 50 to 95° C. under a pressure of 10 to 2000 $kgf/cm^2$. When extrusion molding is used, a flow channel in a metal mold may be designed such that the slurry passes through a narrow discharge port inside the metal mold, then pieces of a green body in a sheet form are integrated into a single body in the metal mold, and the green body is discharged in a laminated state. It is preferable to degrease the resulting green body in accordance with known conditions.

The oriented green body obtained as described above is fired at a firing temperature of 1000 to 1500° C. and preferably 1100 to 1400° C. to form a zinc oxide sintered body comprising oriented zinc oxide crystal grains. The firing time at the aforementioned firing temperature is not particularly limited, and is preferably 1 to 10 hours and more preferably 2 to 5 hours. The zinc oxide sintered body obtained in this way is an oriented sintered body that is, for example, (101), (100), or (002) plane-oriented in accordance with the type of the aforementioned raw-material plate-like zinc oxide powder. The degree of orientation of the sintered body is high, and preferably the degree of orientation at the substrate surface is 50% or greater, more preferably 65% or greater, and even more preferably 75% or greater.

EXAMPLES

The present invention will now be more specifically described by way of the following examples.

Example 1

A photovoltaic device provided with a photovoltaic functional layer based on a p-i-n stacked structure was prepared using a non-doped ZnO oriented sintered body substrate as follows.
(1) Preparation and Evaluation of Non-Doped ZnO Oriented Sintered Body Substrate
(1a) Preparation of Plate-Like Zinc Oxide Powder A non-doped (002) plane-oriented ZnO powder was prepared as follows. 173 parts by weight of zinc sulfate heptahydrate (manufactured by Kojundo Chemical Laboratory Co., Ltd.) and 0.45 parts by weight of sodium gluconate (manufactured by Wako Pure Chemical Industries, Ltd.) were dissolved in 300 parts by weight of ion exchanged water. The solution thus obtained was placed in a beaker and dissolved by heating to 90° C. while being stirred with a magnetic stirrer. This solution was kept at 90° C., and 49 parts by weight of 25% aqueous ammonia was added dropwise with a microtube pump while being stirred. After the end of dropwise addition, the solution was kept at 90° C. for 4 hours while being stirred, and then the solution was added to a large amount of ion exchanged water and left to stand still. The precipitates deposited in the bottom of the vessel were separated by filtration, further, washed with ion exchanged water 3 times, and dried to give a zinc oxide precursor material in the form of a white powder. The resulting zinc oxide precursor material was placed on a zirconia plate and calcined in air in an electric furnace to give a plate-like porous zinc oxide powder. The temperature schedule during calcination was as follows: the temperature was increased at a rate of temperature increase of 100° C./h from room temperature to 900° C., then kept at 900° C. for 30 minutes, and cooled naturally.
(1b) Shaping and Firing Steps 100 parts by weight of the resulting plate-like zinc oxide particles were mixed with 15 parts by weight of a binder (polyvinyl butyral: Part No. BM-2, manufactured by Sekisui Chemical Co., Ltd.), 10 parts by weight of a plasticizer (DOP: di(2-ethylhexyl)phthalate, manufactured by Kurogane Kasei Co., Ltd.), 3 parts by weight of a dispersant (trade name: Rheodol SP-O30, manufactured by Kao Corporation), and a dispersion medium (2-ethylhexanol). The amount of the dispersion medium was adjusted such that the slurry viscosity was 10000 cP. The slurry thus prepared was applied to a PET film by a doctor blade method to form a sheet having a thickness after drying of 20 μm. The resulting tape was cut into 20×20 mm sheet, and 500 pieces of the cut tape were stacked, placed on an aluminum plate having a thickness of 10 mm, and then vacuum-packed. This vacuum pack was subjected to isostatic pressing in hot water at 85° C. under a pressure of 100 $kgf/cm^2$ to prepare a green body in a plate shape. The resulting green body was placed in a degreasing furnace and degreased under 600° C. and 20 hour conditions. The resulting degreased body was fired at atmospheric pressures under 1400° C. and 5 hour conditions in nitrogen to prepare a ZnO oriented sintered body substrate in a plate shape.
(1c) Evaluation of Sintered Body Substrate The resulting ZnO sintered body substrate was evaluated as follows.
(Evaluation of Degree of Orientation)

The degree of (002) plane orientation $F_{(002)}$ of the resulting sintered body was measured by XRD. In this measurement, an XRD profile was obtained by irradiating the surface of plate-like zinc oxide with X rays using an XRD apparatus (manufactured by Rigaku Corporation, trade name "RINT-TTR III"), and evaluations were made according to the following formulae.

$$F_{(002)} = \frac{p - p_0}{1 - p_0} \times 100 \qquad [\text{Formula 2}]$$

$$p_0 = \frac{I_0(002)}{I_0(100) + I_0(002) + I_0(101) + I_0(102)}$$

$$p = \frac{I_s(002)}{I_s(100) + I_s(002) + I_s(101) + I_s(102)}$$

where $F_{(002)}$ is the degree of orientation of the (002) plane; $I_0(002)$, $I_0(100)$, $I_0(101)$, and $I_0(102)$ are the diffraction intensities (integral values) of the (002) plane, (100) plane, (101) plane, and (102) plane in ICDD No. 361451, respectively; and $I_s(002)$, $I_s(100)$, $I_s(101)$, and $I_s(102)$ are the diffraction intensities (integral values) of the (002) plane, (100) plane, (101) plane, and (102) plane in a sample, respectively.

(Evaluation of Average Grain Diameter of Sintered Grains)

The average grain diameter of sintered body grains was measured by the following method. A 5×5×3 mm sample was cut out from the resulting plate-like sintered body, a surface perpendicular to the plate surface was polished and subjected to etching in nitric acid having a concentration of 0.3 M for 10 seconds, and then an image was taken with a scanning electron microscope. The visual field range was determined in such a way that when straight lines parallel and perpendicular to the plate surface were drawn, each straight line crossed 10 to 30 grains. The average grain diameter was determined by: drawing three straight lines parallel to the plate surface; taking the average of the line segment lengths inside all grains crossed by the straight lines; multiplying the average by 1.5 to give a value regarded as $a_1$; similarly, drawing three straight lines perpendicular to the plate surface; taking the average of the line segment lengths inside all grains crossed by the straight lines; multiplying the average by 1.5 to give a value regarded as $a_2$; and calculating $(a_1+a_2)/2$.

(Evaluation of Volume Resistivity)

The volume resistivity of the sintered body was measured by using a resistivity meter (manufactured by Mitsubishi Chemical Corporation, Loresta AX Model MCP-T370) by performing a four-point probe method near the central part of the plate surface of the plate-like sintered body.

As a result, the degree of (002) orientation of the sintered body substrate was 80%, the average grain diameter of sintered grains was 38 µm, and the volume resistivity was $1\times10^{-1}$ $\Omega$·cm.

(2) Preparation of Photovoltaic Device

Polycrystalline Si was deposited on the resulting non-doped ZnO oriented sintered body substrate in the order of an n-layer, an i-layer, and a p-layer. Formation of the polycrystalline Si layers was performed at a substrate temperature of 180° C. using plasma CVD at an excitation frequency of 13.36 MHz. A hydrogen-diluted $SiH_4$ source gas was used as a silicon raw material, and $B_2H_6$ and $PH_3$ were used as doping gases during the deposition of the p-layer and the n-layer, respectively. Each layer was formed at a deposition rate of about 3 Å/sec. Thereafter, an electrode was formed on each of the p-type layer and the n-type layer through a lithography process.

(3) Evaluation of Photovoltaic Device Characteristics

The electrode provided on the p-type layer and the electrode provided on the n-type layer of the photovoltaic device were connected to a multimeter via lead wire, the upper surface of the photovoltaic device was irradiated with simulated sunlight (AM 1.5, 100 mW·cm$^{-2}$), and an output with an open circuit voltage of 0.50 V and a short circuit current of 20 mA·cm$^{-2}$ was confirmed. Since generation of photovoltaic power and a photo current due to sunlight irradiation was confirmed, it was found that the photovoltaic device prepared in this example functions as a solar cell.

Example 2

A photovoltaic device provided with a photovoltaic functional layer based on a p-i-n stacked structure was prepared using an Al-doped n-type ZnO oriented sintered body substrate as follows.

(1) Preparation and Evaluation of Al-Doped n-Type ZnO Oriented Sintered Body Substrate (1a) Preparation of Raw Material Powder An Al-doped (002) plane-oriented ZnO powder was prepared as follows. 8.8 parts by weight of aluminum chloride hexahydrate (manufactured by Kojundo Chemical Laboratory Co., Ltd.) was added to and dissolved in 200 parts by weight of ethanol. Thereafter, the above solution was added to the plate-like zinc oxide particles prepared in Example 1 such that zinc:aluminum=100:0.2 (atomic ratio), this mixture was dried by using a rotary evaporator, and thereby plate-like zinc oxide particles in which the aluminum component was uniformly dispersed was prepared.

(1b) Shaping and Firing

A ZnO oriented sintered body substrate in a plate shape was prepared as in (1b) of Example 1.

(1c) Evaluation of Sintered Body Substrate

The resulting ZnO sintered body substrate was evaluated as in (1c) of Example 1. As a result, the degree of (002) orientation of the sintered body substrate was 80%, the average grain diameter of sintered grains was 35 µm, and the volume resistivity was $8\times10^{-4}$ $\Omega$·cm.

(2) Preparation of Photovoltaic Device

An i-ZnO layer and a p-Zn layer were deposited in this order onto the resulting Al-doped n-type ZnO oriented sintered body substrate. That is, in this example, the substrate itself served as an n-type semiconductor due to the Al doping and had sufficiently low resistance, and therefore formation of an n-type ZnO layer film was omitted. The methods for forming the respective layers were as follows.

(2a) Film Formation of i-Type ZnO Layer by Solid-Phase Epitaxial Growth

Figure 2:
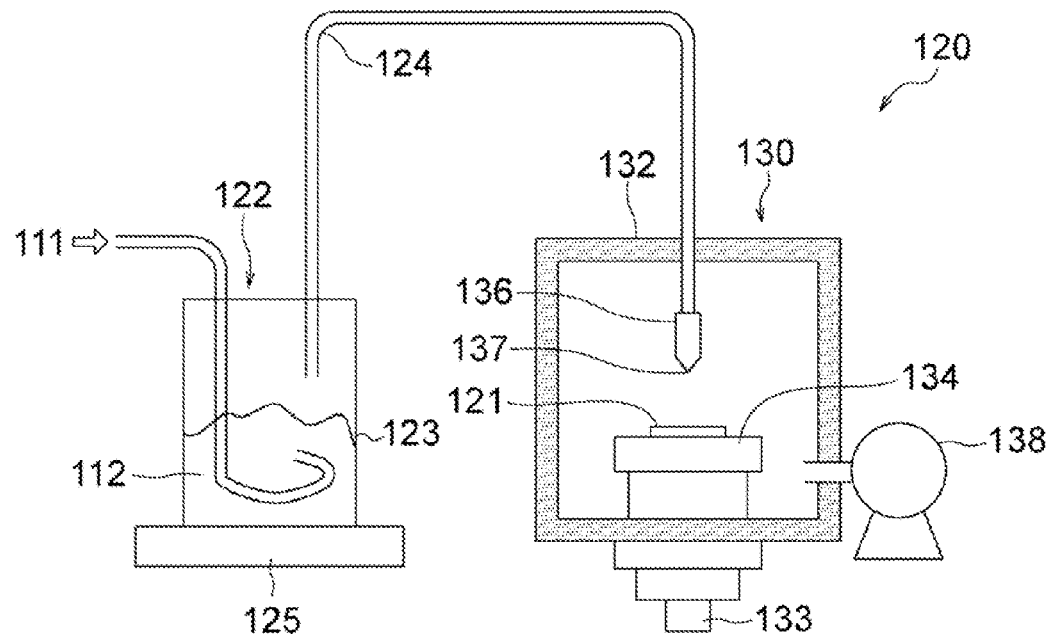
FIG. 2 is a cross-sectional schematic diagram showing the AD film formation apparatus used in Example 2.

Using a commercially available non-doped ZnO powder as a film formation raw material, a p-type ZnO film was deposited on the ZnO oriented sintered body substrate by an aerosol deposition method (hereinafter AD). For AD film formation, a film formation apparatus 120 shown in FIG. 2 was used. This film formation apparatus 120 includes an aerosol generating part 122 for generating an aerosol of a raw material powder containing raw material components and a film forming part 130 for injecting the film forming powder onto a seed substrate 121 to form a film containing the raw material components.

The aerosol generating part 122 includes an aerosol generating chamber 123 for accommodating the raw material powder 112 and generating an aerosol upon receiving a supply of a carrier gas 111 from a gas cylinder (not shown), a raw material supply pipe 124 for supplying the generated aerosol to the film forming part 130, and a vibrator 125 for vibrating the aerosol generating chamber 123 and the aerosol present therein at a frequency of 10 to 100 Hz. The film forming part 130 includes a film forming chamber 132 where the aerosol is injected onto the seed substrate 121, a seed substrate holder 134 that is provided inside the film forming chamber 132 to fix the seed substrate 121, and an X-Y stage 133 for moving the seed substrate holder 134 in the X axis-Y axis direction. Also, the film forming part 130 includes an injection nozzle 136 having a slit 137 formed at the tip for injecting the aerosol onto the seed substrate 121, and a vacuum pump 138 for reducing the pressure of the film forming chamber 132.

In the film forming apparatus 120, nitrogen ($N_2$) gas was allowed to flow at a flow rate of 10 L/min as the carrier gas 111, the pressure of the aerosol generating chamber 123 was 50 kPa, the pressure inside the film forming chamber 132 was 0.1 kPa or less, and the opening size of the slit 137 provided in the film formation powder injection nozzle 136 was 10 mm×0.4 mm. As for the nozzle scanning method during film formation, 1 scan included a scanning distance of 200 mm at a scanning speed of 1 mm/sec, and after the end of 1 scan, a scanning position was moved 10 mm parallelly to perform film formation, and a scan of total 20 rows was performed as one cycle. This film formation was performed total 60 cycles to obtain an AD film having a thickness of about 2.5 μm and composed of N-doped ZnO.

Figure 3:
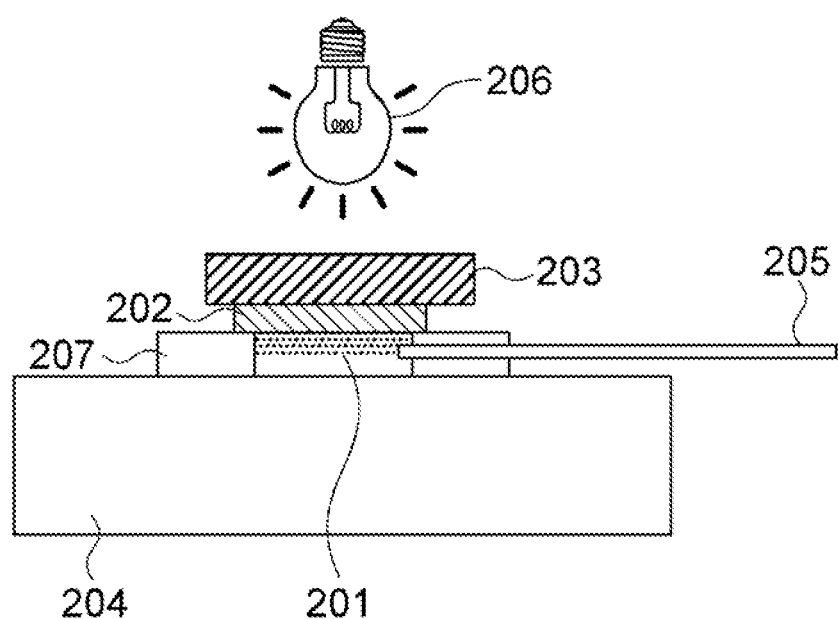
FIG. 3 is a cross-sectional schematic diagram showing the heater used in Example 2.

The resulting ZnO film was subjected to solid-phase epitaxial growth using a heater of FIG. 3. In FIG. 3, a near-infrared lamp 206 is used as a light source for optical heating. Since the near-infrared absorption coefficient of ZnO is low, a platinum plate 203 was provided on a ZnO oriented sintered body substrate 202, and near-infrared rays were irradiated from the ZnO oriented sintered body substrate 202 side to cause the platinum plate 203 to absorb the near-infrared rays, and thereby a film 201 was heated from the ZnO oriented sintered body substrate 202 side. The ZnO oriented sintered body substrate 202 and the platinum plate 203 were placed on a quartz pedestal 204 and a quartz sample retainer 207, and the temperature of the film 201 was measured with a thermocouple 205. A heat treatment was performed in nitrogen, in which the film was heated at a rate of temperature increase of 400° C./min and kept at 1100° C. for 10 minutes. Due to this heat treatment, the ZnO film underwent solid-phase epitaxial growth in conformity with the surface atom arrangement of the ZnO oriented sintered body substrate and became a c-axis-oriented non-doped ZnO layer. Evaluation of orientation by XRD as described in Example 1 showed that the degree of orientation was 79%.

Although a solid-phase epitaxial growth method was used for the film formation of the i-type layer in this example, the production method is not particularly limited, but may include MOCVD, or a technique in which the non-doped ZnO powder is applied by a solution method, such as spin coating or dipping, and then subjected to heat-treating at a temperature of 200 to 700° C.

(2b) Film Formation of p-Type ZnO Layer by Solid-Phase Epitaxial Growth

A p-type ZnO film was deposited on the i-type ZnO layer by an aerosol deposition method (hereinafter AD) in the same manner as the i-type ZnO layer except that a commercially available N-doped p-type ZnO powder (manufactured by Furukawa Denshi Co., Ltd.) was used as a film formation raw material in place of the non-doped ZnO powder, and then subjected to solid-phase epitaxial growth. This solid-phase epitaxial growth yielded a c-axis-oriented N-doped ZnO layer. Evaluation of orientation by XRD as described in Example 1 showed a degree of orientation of 78%.

Although a solid-phase epitaxial method was used for the film formation of the p-type layer in this example, the production method is not particularly limited, but may include MOCVD, or a technique in which the p-type ZnO powder is applied by a solution method, such as spin coating or dipping, and then subjected to heat-treating at a temperature of 200 to 700° C.

(2b) Film Formation of Electrode

An electrode was formed on each of the p-type layer and the back surface of the substrate. Specifically, a 30 nm film of Au was formed as an electrode by an electron beam evaporation method on the p-type ZnO layer. An electrode was formed on the back surface of the substrate in the same manner. The electrode on the p-type ZnO layer was formed in a grid form in order to increase light transmission efficiency.

(3) Evaluation of Photovoltaic Device Characteristics

The electrode provided on the p-type layer and the electrode provided on the back surface of the substrate of the resulting photovoltaic device were connected to a multimeter via lead wire, the upper surface of the photovoltaic device was irradiated with ultraviolet rays (black light, a wavelength of 300 to 400 nm, a peak wavelength of 350 nm), and an output with an open circuit voltage of 1.0 V and a short circuit current of 100 μA was confirmed. Since generation of photovoltaic power and a photo current due to ultraviolet irradiation was confirmed, it was found that the photovoltaic device prepared in this example functions as an ultraviolet sensor.

What is claimed is:

1. A photovoltaic device comprising:
   a substrate composed of an oriented polycrystalline zinc oxide sintered body in a plate shape;
   a photovoltaic layer provided on the substrate; and
   an electrode provided on the photovoltaic layer.

2. The photovoltaic device according to claim 1, wherein zinc oxide single crystal grains constituting the oriented polycrystalline zinc oxide sintered body have an average grain diameter of 1 to 100 μm.

3. The photovoltaic device according to claim 1, wherein the photovoltaic layer has a structure epitaxially grown in conformity with the orientation of the oriented polycrystalline zinc oxide sintered body, and thereby has a crystallographic direction aligned in a normal direction.

4. The photovoltaic device according to claim 1, wherein the oriented polycrystalline zinc oxide sintered body has an orientation in (100) plane, (002) plane, or (101) plane.

5. The photovoltaic device according to claim 1, wherein the oriented polycrystalline zinc oxide sintered body has a degree of orientation of 50% or greater.

6. The photovoltaic device according to claim 1, wherein the photovoltaic layer comprises any one selected from the group consisting of a combination of an n-type layer, an i-type layer, and a p-type layer, a combination of an n-type layer, a buffer layer, and a p-type layer, a combination of an n-type layer and a p-type layer, and a combination of an n-type layer and a metal thin film.

7. The photovoltaic device according to claim 1, wherein the photovoltaic layer comprises any one selected from the group consisting of a combination of an i-type layer and a p-type layer, a combination of a buffer layer and a p-type layer, a p-type layer alone, and a metal thin film alone; and wherein the oriented polycrystalline zinc oxide sintered body is doped with an n-type dopant, and thereby the substrate functions as an n-type layer.

8. The photovoltaic device according to claim 7, wherein the n-type dopant comprises one or more selected from the group consisting of aluminum (Al), gallium (Ga), indium (In), boron (B), fluorine (F), chlorine (Cl), bromine (Br), iodine (I), and silicon (Si).

9. The photovoltaic device according to claim 1, wherein the oriented polycrystalline zinc oxide sintered body is composed of ZnO formed into a mixed crystal with a crystal of one or more selected from the group consisting of MgO, CdO, ZnS, ZnSe, and ZnTe.

10. The photovoltaic device according to claim 1, wherein the substrate functions as a counter electrode.

11. The photovoltaic device according to claim 1, further comprising a counter electrode on the opposite side of the substrate from the photovoltaic layer.

12. The photovoltaic device according to claim 1, wherein the electrode is a transparent conductive film or a metal electrode having a lattice structure or a moth-eye structure.

13. The photovoltaic device according to claim 1, wherein the substrate has an area of 25 cm² or greater.

14. The photovoltaic device according to claim 1, which is any one of a PIN photodiode, a PN photodiode, and a Schottky photodiode.

15. The photovoltaic device according to claim 1, which is used as a silicon-based solar cell or a CIGS-based solar cell.

16. The photovoltaic device according to claim 1, which is used as an ultraviolet sensor.

* * * * *